(12) United States Patent
Pelliconi et al.

(10) Patent No.: US 10,419,011 B1
(45) Date of Patent: Sep. 17, 2019

(54) TIMING ERROR MEASUREMENT IN CURRENT STEERING DIGITAL TO ANALOG CONVERTERS

(71) Applicant: Xilinx, Inc., San Jose, CA (US)

(72) Inventors: Roberto Pelliconi, Dublin (IE); Christophe Erdmann, Dublin (IE); Derek Chang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/108,003

(22) Filed: Aug. 21, 2018

(51) Int. Cl.
 *H03M 1/10* (2006.01)
 *H03M 1/74* (2006.01)
 *H03M 1/66* (2006.01)

(52) U.S. Cl.
 CPC ....... *H03M 1/1071* (2013.01); *H03M 1/1009* (2013.01); *H03M 1/66* (2013.01); *H03M 1/745* (2013.01); *H03M 1/747* (2013.01)

(58) Field of Classification Search
 CPC ...... H03M 1/1071; H03M 1/66; H03M 1/745; H03M 1/747; H03M 1/1009
 USPC .......................................... 341/118, 120, 144
 See application file for complete search history.

(56) References Cited

U.S. PATENT DOCUMENTS

| 8,890,730 | B2 | 11/2014 | Lowney et al. | |
| 9,046,908 | B2 * | 6/2015 | Gong | G05F 1/46 |
| 9,313,017 | B1 | 4/2016 | Liao et al. | |
| 9,432,036 | B1 | 8/2016 | Lowney et al. | |
| 2006/0158360 | A1 * | 7/2006 | Briaire | H03M 1/1057 341/144 |

* cited by examiner

*Primary Examiner* — Khai M Nguyen
(74) *Attorney, Agent, or Firm* — Patterson + Sheridan, LLP

(57) ABSTRACT

An example timing error measurement system includes a digital-to-analog converter (DAC) having a plurality of current steering circuits, the DAC responsive to a clock signal, a one-bit comparator coupled to a differential output of the DAC, a filter coupled to an output of the one-bit comparator, control logic coupled to an output of the filter, and a delay line coupled to an output of the control logic. An output of the delay line is coupled to an input of the one-bit comparator. The delay line is configured to delay the clock signal.

20 Claims, 5 Drawing Sheets

TIMING ERROR MEASUREMENT IN CURRENT STEERING DIGITAL TO ANALOG CONVERTERS

TECHNICAL FIELD

Examples of the present disclosure generally relate to electronic circuits and, in particular, to timing error measurement in current steering digital to analog converters (DACs).

BACKGROUND

A current-steering digital to analog converter (DAC) can be constructed of from multiple equal current sources, each steering all the current to one side or the other of the differential outputs. One pre-requisite to achieve excellent linearity at high frequency is that the steering of each individual current source happens exactly at the same time instant (e.g., controlled by a clock). If some switch toggle consistently before some other switch, a harmonic distortion will be visible in the output spectrum. Dynamic element matching can be used to dynamically change the "logic" definition of each unit at each clock cycle. This approach relies on the "randomness" of the unit scrambling and can be implemented using digital logic. But, rather than correcting the problems, this technique only transforms the "non-linearity" into "noise." Another technique measures the timing mismatch between the units with a mixer and a high-dynamic range/low-speed analog to digital converter (ADC). Once the relative between units timing errors are identified, a correction or logic re-ordering can be applied to the units in order to respectively correct or minimize the error profile. This technique has the drawback that it requires a dedicated high dynamic range ADC, which is very difficult and time consuming to design.

SUMMARY

Techniques for timing error measurement in current steering digital to analog converters (DACs) are described. In an example, a timing error measurement system includes: a digital-to-analog converter (DAC) having a plurality of current steering circuits, the DAC responsive to a clock signal; a one-bit comparator coupled to a differential output of the DAC; a filter coupled to an output of the one-bit comparator; control logic coupled to an output of the filter; and a delay line coupled to an output of the control logic, an output of the delay line coupled to an input of the one-bit comparator, the delay line configured to delay the clock signal.

In another example, a method of timing error measurement includes: selecting a current steering circuit to test of a plurality of current steering circuits in a digital to analog converter (DAC); applying a clock pattern to the selected current steering circuit; delaying the clock pattern with a delay line and applying a delayed clock pattern to a one-bit comparator configured to compare a differential output of the DAC; adjusting the delay line to sweep an observation instant of the one-bit comparator coupled to a to detect a crossing point of the differential output; and saving a digital code representing a time delay associated with the crossing point of the differential output.

In another example, an integrated circuit (IC) includes: programmable logic; and a timing error measurement system, comprising: a digital-to-analog converter (DAC) having a plurality of current steering circuits, the DAC responsive to a clock signal; a one-bit comparator coupled to a differential output of the DAC; a filter coupled to an output of the one-bit comparator; control logic coupled to an output of the filter; and a delay line coupled to an output of the control logic, an output of the delay line coupled to an input of the one-bit comparator, the delay line configured to delay the clock signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
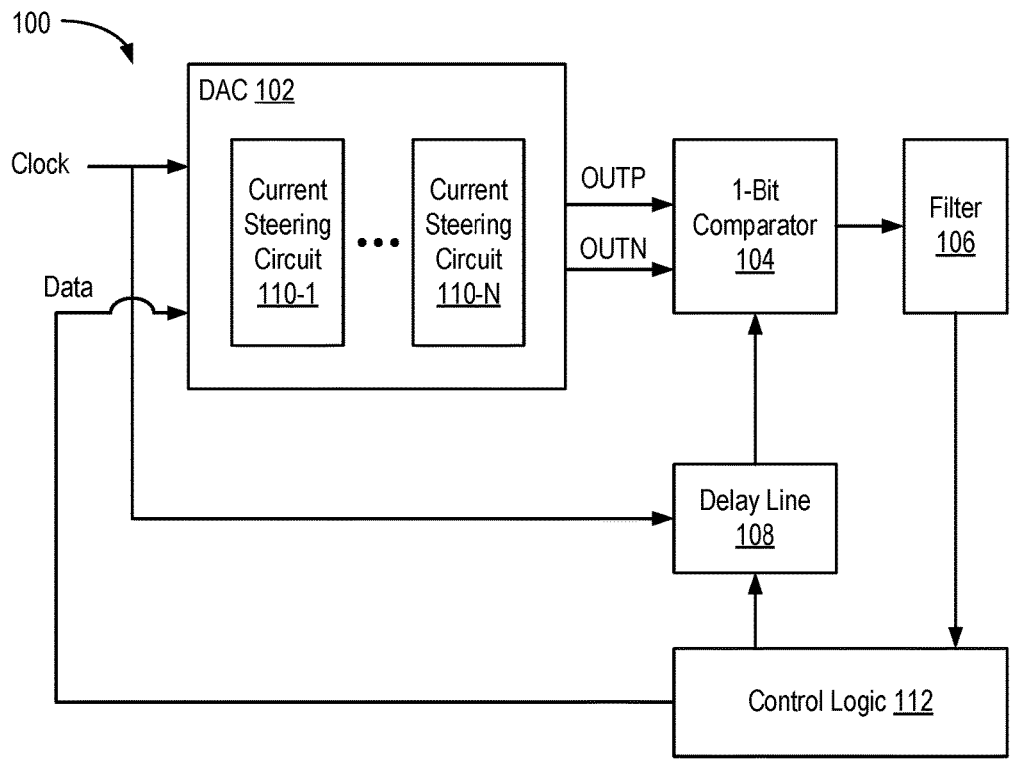
FIG. 1 is a block diagram depicting a timing error measurement system according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for timing error measurement in current steering digital to analog converters (DACs) are described. The techniques can measure the timing skews down to the order of tens of femtoseconds in a system having equally parallel structures, such as current steering DACs. Timing errors are one of the most critical non-idealities that affect performance of analog circuits. In a DAC, these timing errors appear in the output spectrum as spurious components, mainly second and third order harmonics (but also higher order harmonics), which cannot be managed by any frequency planning. The most commonly used architecture for high-performance, high-frequency DACs is current steering, which relies on several parallel unit currents and related switches contributing to the synthesis of the output analog signal.

One reason for timing errors is the asymmetric layout of each individual current unit. Good layout practice can help to minimize this problem, but it can be difficult to observe errors on the order of tens of femtoseconds, even with parasitic-extracted tools. Once such errors are detected and simulated, the solution is not always effective. Another reason for timing errors is manufacturing mismatch of each current unit in the current steering DAC.

FIG. 1 is a block diagram depicting a timing error measurement system 100 according to an example. The timing error measurement system 100 includes a digital-to-analog converter (DAC) 102, a 1-bit comparator 104, a filter 106, a delay line 108, and control logic 112. A differential output of the DAC 102, which includes components OUTP and OUTN, is coupled to an input of the 1-bit comparator 104. An output of the 1-bit comparator 104 is coupled to an input of the filter 106. An output of the filter 106 is coupled to an input of the control logic 112. One output of the control logic 112 is coupled to an input of the delay line 108. Another output of the control logic 112 is coupled to a first input of the DAC 102. An output of the delay line 108 is coupled to another input of the 1-bit comparator 104. A clock signal is coupled to inputs of the DAC 102 and the delay line 108. The DAC 102 includes current steering circuits 110-1 through 110-N, where N is an integer greater than one. The current steering circuits 110 each have the same construction and are controlled by the inputs of the DAC 102. Based on the inputs, one of more of the current steering circuits 110 contributes current for generating a differential voltage at the output of the DAC 102.

Figure 2:
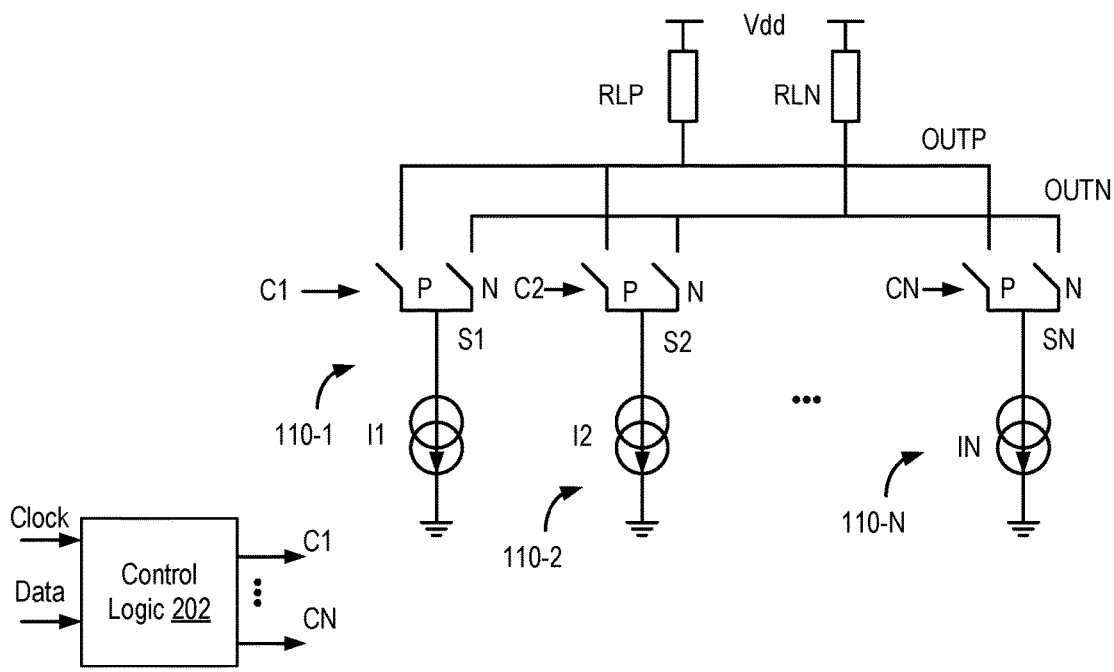
FIG. 2 is a schematic diagram depicting an example of a digital to analog converter (DAC) according to an example.

FIG. 2 is a schematic diagram depicting an example of the DAC 102. The current steering circuits 110-1 . . . 110-N include current sources I1 . . . IN and switch circuits S1 . . . SN. Each of the switch circuits S1 . . . SN includes a P switch and an N switch (e.g., implemented using P-type and N-type metal oxide semiconductor field effect transistors (MOSFETs)). The P switches couple the respective current sources I1 . . . IN to the node OUTP. The N switches coupled the respective current sources I1 . . . IN to the node OUTN. A resistor RLP is coupled between a voltage source Vdd and the node OUTP. A resistor RLN is coupled between the voltage source Vdd and the node OUTN. The DAC 102 includes control logic 202 configured to generate N selection signals C1 . . . CN based on the clock and data input signals. The selection signals C1 . . . CN control the states of the P and N switches in each of the switch circuits S1 . . . SN, respectively. In examples described below, the data signal determines which of the current steering circuits 110-1 through 110-N receive the clock signal as a respective selection signal.

With reference to FIGS. 1-2, when converting a digital input to an analog output, in the ideal case, all of the switch circuits S1 . . . SN being switched should be triggered simultaneously. One of the pre-requisites to achieve excellent linearity performance at high output frequency is that the steering of each individual current source happens at the same time instant. If some switch toggles consistently before some other switch, a harmonic distortion will be visible in the output spectrum.

One technique to measure the timing error of the switches in the DAC 102 is to use a high-resolution range analog-to-digital converter (ADC) at low frequency to measure each timing error. Two current steering circuits are compared (one taken as a reference and the other under test) and the timing skew is detected between them. A high-resolution ADC operates at low frequency so a mixer operation is required preceding the measurement. Further, a high-resolution ADC is a complex design with a high cost of development that is only used for calibration of the DAC 102.

An improved technique is shown in FIG. 1. The timing error measurement system 100 does not require the use of a mixer or a high-resolution ADC. Rather, the timing error measurement system 100 includes a 1-bit comparator 104 used as a 1-bit ADC. The delay line 108 is used to skew the sampling instant of the comparator 104. In an example, the delay line 108 is a digital to time converter (DTC). A DTC is a less complex circuit than a high-resolution ADC.

Figure 3:
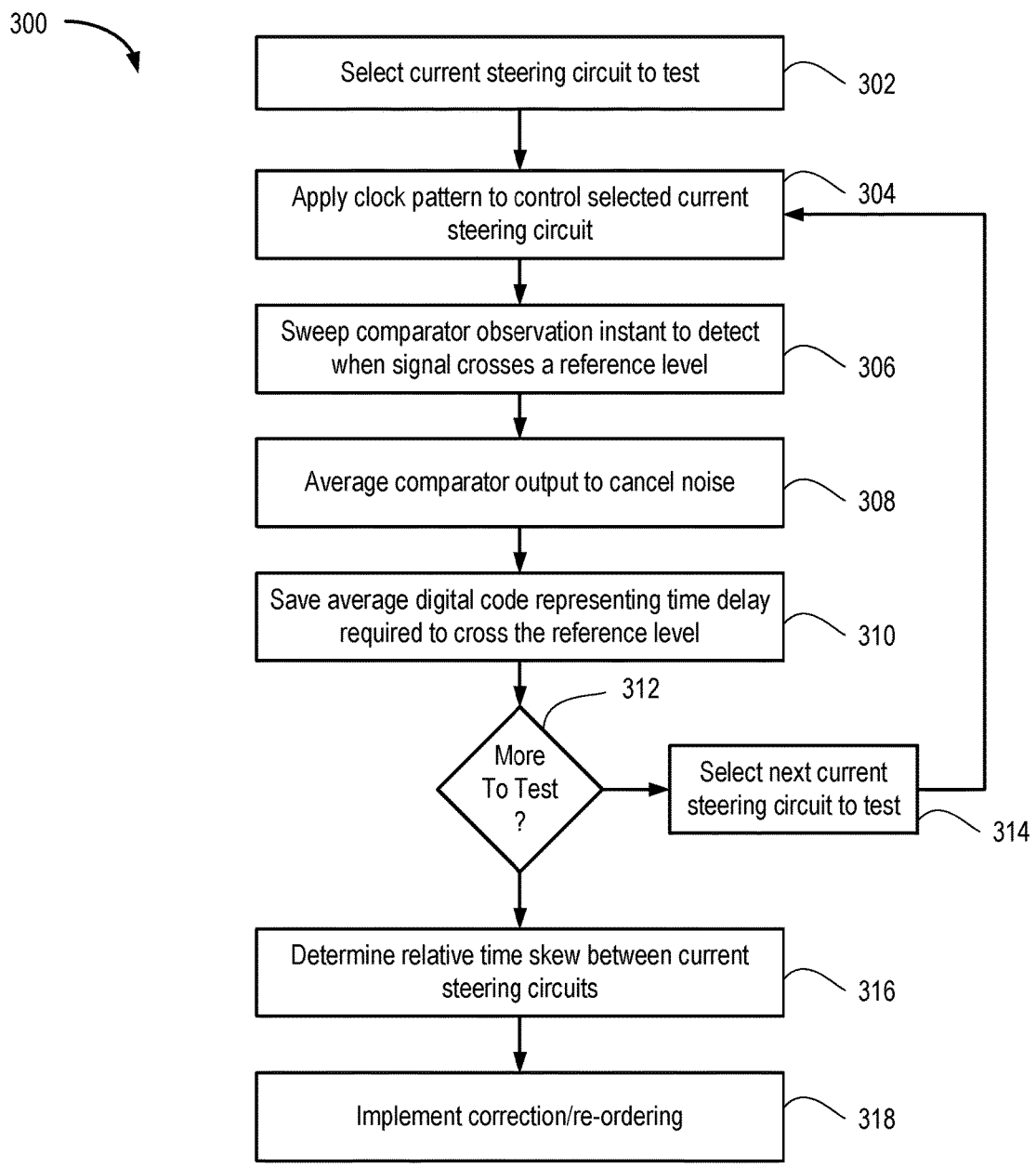
FIG. 3 is a flow diagram depicting a method for determining timing error measurements according to an example.

FIG. 3 is a flow diagram depicting a method 300 for determining timing error measurements according to an example. Operation of the timing error measurement system 100 can be understood with reference to the method 300. The method 300 begins at step 302, where the control logic 112 selects a current steering circuit 110 to test. The control logic 112 can set the data signal to select a particular current steering circuit 110. By setting the data signal accordingly, the control logic 202 in the DAC 102 supplies a selection signal to the selected current steering circuit 110, where the selection signal is the clock signal. Thus, the selection signal toggles with a 0-1-0-1 . . . logic pattern, which steers the current through RLP and RLN alternately.

Figure 4A:
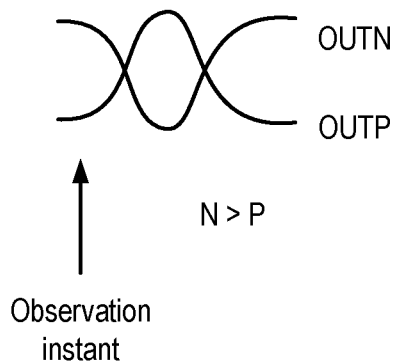
FIGS. 4A-4C depict different observation instants of a comparator in the timing error measurement system of FIG. 1.
Figure 4B:
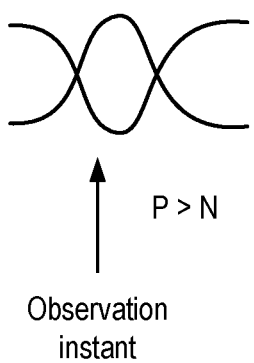
Figure 4C:
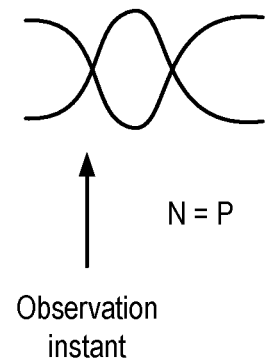

At step 304, the control logic 112 applies a clock pattern to the selected current steering circuit 110, as noted above. At step 306, the control logic 112 sweeps the observation instant of the comparator 104 to detect when the signal crosses a reference level. The control logic 112 supplies a sequence of digital codes to the delay line 108, which changes the delay of the clock signal over time. The delay line 108 outputs a delayed clock to the comparator 104 to set the observation instant. By supplying different digital codes, the control logic 112 changes the observation instant of the comparator 104 over time. FIG. 4A shows a depiction of the comparator observation instant where OUTN is greater than OUTP. In such case, the control logic 112 continues to adjust the digital code. FIG. 4B shows a depiction of the comparator observation instant where OUTP is greater than OUTN. In such case, the control logic 112 continues to adjust the digital code. FIG. 4C shows a depicting of the comparator observation instant where OUTP and OUTN are substantially the same. In such case, the control logic 112 has detected the crossing point and records the digital code used to generate the observation instant.

At step 308, the filter 106 averages the comparator output to cancel noise over time. The average comparator output is provided to the control logic 112, which the control logic 112 uses to determine when the crossing point has been detected. At step 310, the control logic 112 saves the average digital code representing the time delay required to cross the reference level (e.g., OUTN=OUTP). At step 312, the control logic 112 determines if there are additional current steering circuits to test. If so, the method 300 proceeds to step 314, where the next current steering circuit is selected. The method 300 then repeats starting at step 304. If there are no more current steering circuits 110 to test, the method 300 proceeds to step 316.

At step 316, the control logic 112 determines relative time skew between the current steering circuits 110. That is, once the information of timing skew with respect to the common clock signal is available, the relative circuit-to-circuit time skews can be calculated. At step 318, the control logic 112 can implement correction/re-ordering based on the time skew information. An advantage with respect to existing solutions is that the techniques described above are more digitally oriented and easily scalable with process node time-domain solution versus existing voltage domain. The improvement is given by the use of a delay line and comparator implementation instead of a mixer and high-resolution ADC implementation. The techniques can be extended to any application where detecting the timing alignment between different contributors of a circuit is a key factor for performance.

Figure 5:
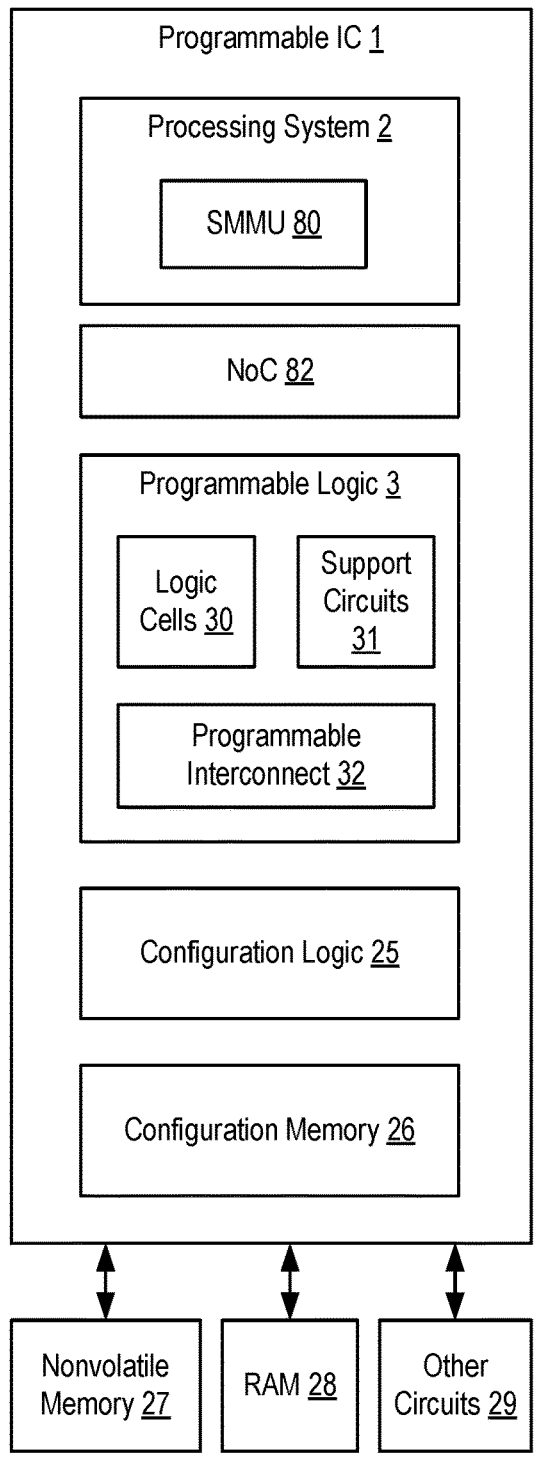
FIG. 5 is a block diagram depicting a programmable IC according to an example in which the timing error measurement system can be employed.

FIG. 5 is a block diagram depicting a programmable IC 1 according to an example. The programmable IC 1 includes a processing system 2, programmable logic 3, a network on chip (NoC) 82, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). The processing system 2 can include microprocessor(s), memory, support circuits, IO circuits, and the like. In examples described herein, the processing system 2 includes a system memory management unit (SMMU) 80. The SMMU 80 is a separate memory management unit for use by PS and PL masters that do not have a built-in MMU. The NoC 82 includes circuitry for providing physical and logical connections between configured and/or hardened circuits in the programmable IC 1.

Figure 6:
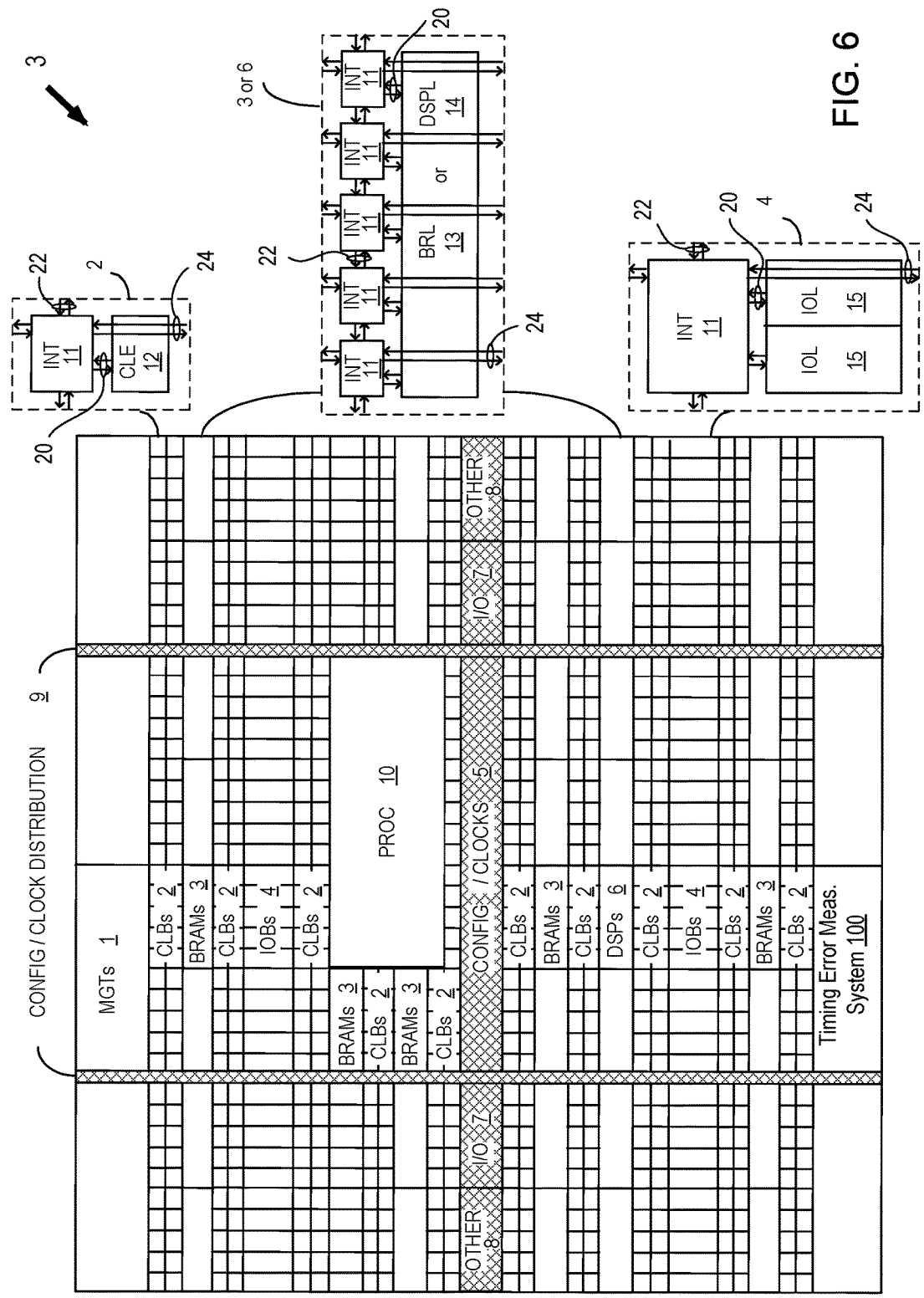
FIG. 6 illustrates programmable logic of the programmable IC of FIG. 5 according to an example.

FIG. 6 illustrates programmable logic 3 of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The programmable logic 3 can also include PCIe interfaces 40, analog-to-digital converters (ADC) 38, and the like. The IC 1 can include the timing error measurement system 100 described above.

In some programmable logic, each programmable tile can include at least one programmable interconnect element ("INT") 43 having connections to input and output terminals 48 of a programmable logic element within the same tile, as shown by examples included at the top of FIG. 6. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated programmable logic.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 6) is used for configuration, clock, and other control logic. Vertical columns 51 extending from this horizontal area or column are used to distribute the clocks and configuration signals across the breadth of the programmable logic.

Some programmable logic utilizing the architecture illustrated in FIG. 6 include additional logic blocks that disrupt the regular columnar structure making up a large part of the programmable logic. The additional logic blocks can be programmable blocks and/or dedicated logic.

Note that FIG. 6 is intended to illustrate only an exemplary programmable logic architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual programmable logic more than one adjacent row of CLBs is typically included wherever the CLBs appear, to facilitate the efficient implementation of user logic, but the number of adjacent CLB rows varies with the overall size of the programmable logic.

While the foregoing is directed to specific examples, other and further examples may be devised without departing from the basic scope thereof, and the scope thereof is determined by the claims that follow.

What is claimed is:

1. A timing error measurement system, comprising:
   a digital-to-analog converter (DAC) having a plurality of current steering circuits, the DAC responsive to a clock signal;
   a one-bit comparator coupled to a differential output of the DAC;
   a filter coupled to an output of the one-bit comparator;
   control logic coupled to an output of the filter; and
   a delay line coupled to an output of the control logic, an output of the delay line coupled to an input of the one-bit comparator, the delay line configured to delay the clock signal.

2. The system of claim 1, wherein the control logic is further coupled to an input of the DAC to control which of the plurality of current steering circuits receives the clock signal.

3. The system of claim 1, wherein each of the plurality of current steering circuits comprises a current source coupled to a pair of resistors through a respective pair of switches.

4. The system of claim 1, wherein the control logic is configured to provide a plurality of digital codes to the delay line to sweep an observation instant of the one-bit comparator over time.

5. The system of claim 4, wherein the control logic is configured to save a digital code representing a time delay associated with a crossing point of the differential output of the DAC.

6. The system of claim 1, wherein the filter is configured to average the output of the one-bit comparator.

7. The system of claim 1, wherein the delay line comprises a digital-to-time converter (DTC).

8. A method of timing error measurement, comprising:
selecting a current steering circuit to test of a plurality of current steering circuits in a digital to analog converter (DAC);
applying a clock pattern to the selected current steering circuit;
delaying the clock pattern with a delay line and applying a delayed clock pattern to a one-bit comparator configured to compare a differential output of the DAC;
adjusting the delay line to sweep an observation instant of the one-bit comparator coupled to a to detect a crossing point of the differential output; and
saving a digital code representing a time delay associated with the crossing point of the differential output.

9. The method of claim 8, further comprising:
selecting another one of the plurality of current steering circuits to test;
performing the steps of applying, delaying, adjusting, and saving subsequent to selecting the other one of the plurality of current steering circuits.

10. The method of claim 9, further comprising:
determining a relative time skew between the selected current steering circuit and the other current steering circuit.

11. The method of claim 10, further comprising:
implementing correction of timing error of the DAC based on the determined relative time skew.

12. The method of claim 8, further comprising:
averaging output of the one-bit comparator to cancel noise.

13. The method of claim 8, wherein the delay line comprises a digital-to-time converter (DTC).

14. An integrated circuit (IC), comprising:
programmable logic; and
a timing error measurement system, comprising:
    a digital-to-analog converter (DAC) having a plurality of current steering circuits, the DAC responsive to a clock signal;
    a one-bit comparator coupled to a differential output of the DAC;
    a filter coupled to an output of the one-bit comparator;
    control logic coupled to an output of the filter; and
    a delay line coupled to an output of the control logic, an output of the delay line coupled to an input of the one-bit comparator, the delay line configured to delay the clock signal.

15. The IC of claim 14, wherein the control logic is further coupled to an input of the DAC to control which of the plurality of current steering circuits receives the clock signal.

16. The IC of claim 14, wherein each of the plurality of current steering circuits comprises a current source coupled to a pair of resistors through a respective pair of switches.

17. The IC of claim 14, wherein the control logic is configured to provide a plurality of digital codes to the delay line to sweep an observation instant of the one-bit comparator over time.

18. The IC of claim 17, wherein the control logic is configured to save a digital code representing a time delay associated with a crossing point of the differential output of the DAC.

19. The IC of claim 14, wherein the filter is configured to average the output of the one-bit comparator.

20. The IC of claim 14, wherein the delay line comprises a digital-to-time converter (DTC).

* * * * *